United States Patent
Daniel

(10) Patent No.: US 9,554,475 B2
(45) Date of Patent: Jan. 24, 2017

(54) METHOD OF MANUFACTURING A FLEXIBLE ELECTRONICS MODULE

(71) Applicant: Palo Alto Research Center Incorporated, Palo Alto, CA (US)

(72) Inventor: Jurgen H. Daniel, Washington, DC (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 0 days.

(21) Appl. No.: 13/953,327

(22) Filed: Jul. 29, 2013

(65) Prior Publication Data

US 2013/0305529 A1 Nov. 21, 2013

Related U.S. Application Data

(62) Division of application No. 12/916,221, filed on Oct. 29, 2010, now Pat. No. 8,520,399.

(51) Int. Cl.
| | |
|---|---|
| H05K 7/00 | (2006.01) |
| H05K 3/30 | (2006.01) |
| H05K 1/02 | (2006.01) |
| H05K 1/18 | (2006.01) |
| H05K 3/28 | (2006.01) |

(52) U.S. Cl.
CPC ............. *H05K 3/30* (2013.01); *H05K 1/0283* (2013.01); *H05K 1/189* (2013.01); *H05K 3/284* (2013.01); *H05K 2201/09063* (2013.01); *H05K 2203/1316* (2013.01); *Y10T 29/4913* (2015.01); *Y10T 29/49146* (2015.01)

(58) Field of Classification Search
CPC .................... H05K 1/118; H05K 1/182–1/189; H01L 2924/01078
USPC ........... 174/254–258, 262–264; 29/840–853; 361/760–766, 749, 803
See application file for complete search history.

(56) References Cited

U.S. PATENT DOCUMENTS

| | | | |
|---|---|---|---|
| 6,694,610 B1 | 2/2004 | Kitade | |
| 7,488,903 B2 * | 2/2009 | Kawagishi | ............ H01L 21/561 174/377 |
| 7,989,928 B2 * | 8/2011 | Liao | ....................... H01L 21/568 257/659 |
| 8,030,750 B2 | 10/2011 | Kim et al. | |
| 8,212,340 B2 | 7/2012 | Liao | |
| 2003/0157437 A1 | 8/2003 | Yamamoto et al. | |
| 2009/0294928 A1 | 12/2009 | Kim et al. | |
| 2009/0302446 A1 * | 12/2009 | Lee et al. | ....................... 257/680 |
| 2010/0207257 A1 * | 8/2010 | Lee | ............................... 257/660 |

* cited by examiner

*Primary Examiner* — Tuan T Dinh
(74) *Attorney, Agent, or Firm* — Marger Johnson

(57) ABSTRACT

A method of manufacturing a flexible electronics module includes mounting at least two functional components onto a flexible substrate, forming stretchable electrical interconnects configured to provide connection between the two functional components, and cutting shapes into the flexible substrate to increase an ability of the flexible substrate to stretch and flex, wherein the electrical interconnects to the functional components are placed to avoid the shapes.

7 Claims, 5 Drawing Sheets

METHOD OF MANUFACTURING A FLEXIBLE ELECTRONICS MODULE

CROSS REFERENCE TO RELATED APPLICATION

This application is a divisional of U.S. patent application Ser. No. 12/916,221, filed Oct. 29, 2010, titled "Stretchable Electronics Modules and Circuits," which is incorporated herein in its entirety.

BACKGROUND

Renewable energy resources, such as wind and solar, have become much more popular as people seek alternative energy sources. With the rise in demand, solar products have undergone considerable changes from the traditional, large area solar panels in rigid frames. Solar panels have become smaller, lighter and much more modular.

Some photovoltaic modules now reside on flexible, bendable substrates. Manufacturers that produce flexible solar modules include Unisolar, Global Solar and Konarka. These flexible solar substrates generally consist of thin, stainless steel foil or thin, polymer foil. In addition to photovoltaic modules, these substrates may also include sensors or other electronic modules and circuits. While these substrates have more flexibility and are more bendable than previous substrates, there is still room for improvement.

Some efforts have concentrated on bending more traditional substrates by selectively cutting or notching the substrates to allow them to conform to more three-dimensional shapes. Examples of this approach include U.S. patent application Ser. No. 12/017,974, published as US Patent Publication No. 20090184954; and Ser. No. 12/253,390, Published as 20100096729. In the approach discussed in these publications, an electronics circuit and its components are laid out on a flexible circuit substrate. The process then cuts the flexible circuit substrate to allow it to be bent, shaped or molded into a three-dimensional device.

Similarly, U.S. patent application Ser. No. 12/563,945, "Shaped Active Matrix Displays," discusses a combination of the cutting for shaping and the lay out of the circuits to allow for perforations to be formed in the substrate, or for the substrate to take a particular shape, such as that of an alphabetic character.

The approach taken in these references, however, involves cutting or perforating the substrate for flexibility and shaping, it does not address stretchability.

DETAILED DESCRIPTION OF THE EMBODIMENTS

Figure 1:
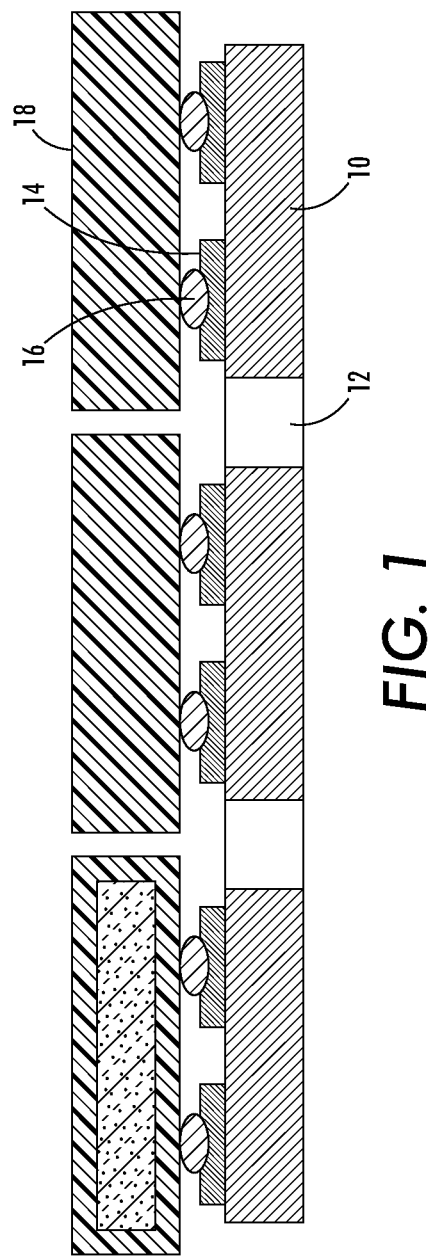
FIG. 1 shows an embodiment of an electronics module having a flexible, perforated substrate.

FIG. 1 shows an embodiment of an electronics module having a flexible, perforated substrate 10. The term module as used here means a set of electronically functional components 18 residing on the substrate 10, where at least two of those functional components have electrical connections between them. An electronically functional component may provide electrical power; use or exchange power; generate, receive or exchange electrical signals with other functional components, as examples. The functional components may consist of many different types, including a solar cell component, a battery, a display component, a power regulator, pixel circuits, memory cells, light emitting devices, MEMS devices and a sensor.

The display components may consist of electrophoretic display, electrochromic display, liquid crystal display, MEMS interference display, electrowetting display, powder display, electrochemical display, organic or inorganic light emitting display, and plasma display. The sensor component may consist of a photodiode, an accelerometer, a pressure sensor, a motion sensor, a moisture sensor, a gas sensor, a radiation sensor, a biological sensor, or a chemical sensor.

The functional components reside on a flexible substrate. The flexible substrate may consist of stainless steel foil, polymer foil, polyimide foil, polyester such as Mylar™ foil and polyethylene naphthalate (PEN) foil, paper or paper-like material or a woven or non-woven fabric. For ease of discussion, the embodiments shown in FIGS. 1-3 have the electrical interconnects such as 14 underneath the functional components. This will generally result from the electrical interconnects being formed prior to the mounting of the functional components, as will be discussed in more detail below.

The forming of the electrical interconnects may result from one of many processes. If the flexible substrate 10 consists of a conductive material, an insulative coating may reside on the surface of the conductive material, with selected parts removed to expose the conductive portions. Alternatively, the interconnects 14 could be formed via printing or metal deposition and selective etching. The interconnect 14 may be, for example, deposited and patterned by screen printing of conductive silver paste. While it is not required that the interconnects be stretchable, an advantage lies in the use of stretchable materials, such as electrically conductive pastes, elastomers and flexible polymers. Examples of stretchable conductors are Metalon FS-066 and FS-067 stretchable nanosilver ink from Nova-Centrix of Austin, Tex., which retains conductivity up to 100% elongation, or Metallograph™ elastic conductive inks from IIMAK of Amherst, NY. The functional components in this embodiment lay on the top of the interconnects, possibly assisted by an electrically conductive adhesive 16 to promote a robust electrical connection. The connection 16 may also be a solder connection.

The functional components may result from being manufactured on the surface of the flexible substrate such as by printing or thin-film techniques such as evaporation, sputtering or chemical vapor deposition. Alternatively, the functional components may result from a separate manufacturing process and then mounted as discrete elements. The mounting process may include transfer printing or pick-and-place technology. In one example the functional components may be regions or parts of back contact solar cells, including metal or emitter wrap-through cells. A solar cell wafer may be diced into smaller solar cell chips by sawing or laser dicing. These chips are then transferred onto the flexible substrate and bonded to the conductive traces 14 of the flexible substrate. In some cases, anisotropic conductive tape may be used to form the contact between the functional element and the conducting traces on the substrate.

An advantage of the printing and thin-film technique formation lies in the ability to form potentially less expensive modules and modules with a thinner form factor. However, an advantage of mounting the functional components as discrete elements lies in the ability to place them appropriately on the flexible substrate to avoid the perforations such as 12 and in the ability to use high performance devices that are made using high temperature processes. Both processes could be done in through roll-to-roll or web print processing.

Figure 2:
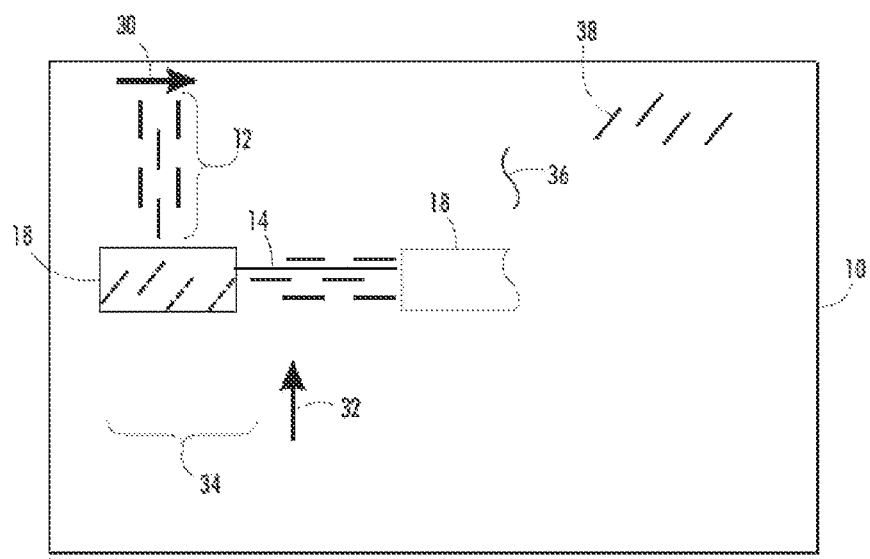
FIG. 2 shows a top view of a perforated substrate and variations on shapes of perforations.

The perforations have shapes and positions to allow the substrate to stretch. Flexible substrates can generally bend and twist, but not stretch. By selectively perforating the substrate, one can allow the substrate to stretch. FIG. 2 shows a top view of a portion of a flexible substrate 10 having perforations. In one particular example, the perforations such as 12 perforate the substrate vertically as oriented on the page. These will allow the substrate to stretch horizontally in the direction of the arrow 30. The perforations typically have longitudinal shape with a lateral dimension much wider than a longitudinal dimension. In one example they are simple longitudinal cuts in which the substrate material is only perforated without removing a substantial amount of substrate material. As described below, the cuts may have more complex shapes such as zigzag or curved shapes. However, the perforations also may have removed some substrate material. Nevertheless, in such a case, the shape of the perforations or the apertures, is much wider in one direction than in the other direction. For example, the perforation could have a rectangular shape with an aspect ratio (lateral: longitudinal dimension) of at least 1:10. Alternatively, the perforations 34 have perforated the substrate horizontally, allowing the substrate to stretch vertically in the direction of the arrow 32. The perforations are arranged so that a tensile force on the substrate causes a torsional moment on segments of the substrate. This torsional moment causes an out of plane twist of segments of the substrate material which in turn results in stretching of the substrate. The direction of the perforations may also vary in areas to allow stretchability in various directions. For example, areas with horizontal perforations may be located adjacent to areas with vertical perforations. Or, horizontal and vertical perforations may be intermixed.

Alternative configurations of perforations include angled perforations such as 38 and 'S-shaped' perforations such as 36 or zigzag patterns. The perforations may take many shapes, left up to the designer, to meet whatever stretchability requirements the substrate may have. In addition, the functional components such as 18 with interconnects such as 14 may take on a shape that conforms to the shapes of the perforations, as shown by the component 18 having one end to match the S-shaped perforation. The functional elements may be located in between or partially in between the perforation or they may cover some of the perforations. If they cover some perforations, the substrate may be prevented from stretching in this area if the functional elements are rigid. The spacing between the functional elements then determines the degree of stretchability that is allowed.

Figure 3:
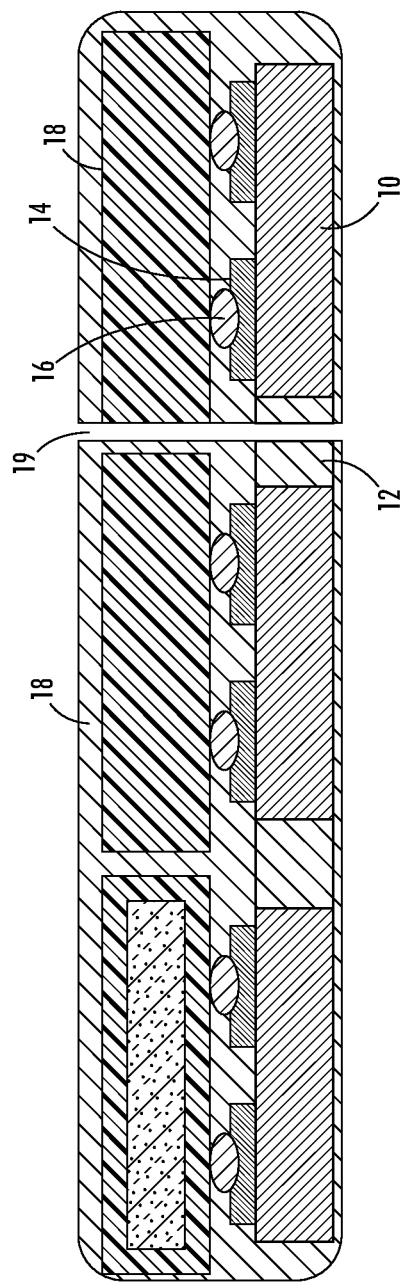
FIG. 3 shows an embodiment of an electronics module having a flexible, perforated substrate.

FIG. 3 shows an optional elastomer encapsulation 20. The elastomer may consist of such materials as silicone, urethane or acrylate. While the elastomer may coat the apertures, cuts or perforations, it is elastic itself so it would not prohibit stretching. The elastomer may protect the functional components, interconnects and the substrate from contaminants or moisture, may assist in solidifying electrical connections and may prevent uncontrolled tearing at the perforations under stretching stress. The encapsulation may also carry perforations and the perforations may have been fabricated after applying the encapsulation as shown by perforation 19. In the latter case, the encapsulation does not have to be an elastomeric material. The encapsulation may be applied by a coating step such as dip coating, spray coating or lamination. For example, a dip-coated fluorocarbon coating such as Cytop (Asahi Glass) or dip-coated silicone materials such as 1-2577 conformal coating from Dow Corning may be used. It may also be evaporated such as in the case of evaporated Parylene. Laminated encapsulation materials may include moisture barrier materials such as the Scotchpak series from 3M Corporation. The encapsulation material may be transparent to light where it is required, such as in the case of the functional elements being photosensors, solar cells or light emitting of display devices.

Figure 4:
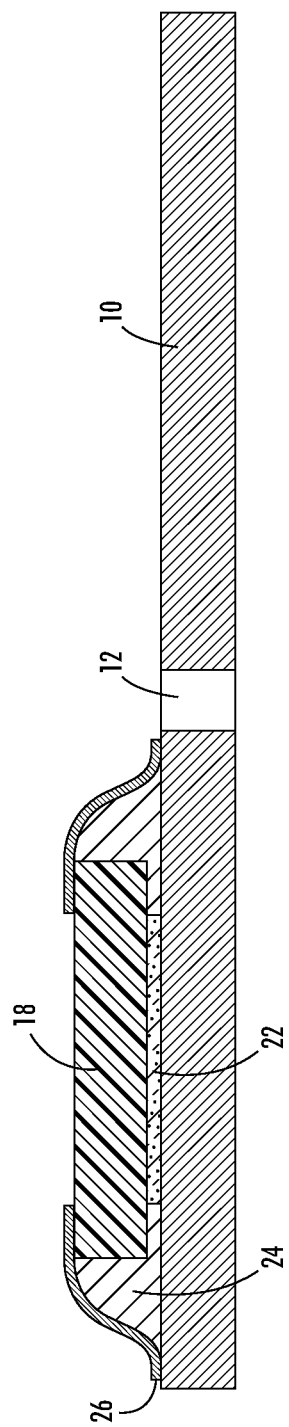
FIG. 4 shows an embodiment of an electronics module having a flexible, perforated substrate encapsulated in an elastomer.

As discussed above, the embodiments of FIGS. 1-3 show the functional components laying on top of the electrical interconnects, bonded to them similar to flip-chip devices. Alternatively, the functional components may be mounted onto the substrate first and then the interconnects formed between them. FIG. 4 shows an embodiment of an electronics module having later-formed interconnects. In this particular example, the functional components such as 18 attach to the substrate by an adhesive 22.

The functional component 18 has its electrical connections on the top surface of the component to allow later-formed connections after mounting. In order to facilitate the printing of the interconnects to reach the electrical connections, a ramp 24 may be printed on the sides of the functional components 18. This allows the printing of the interconnect material 26 on the ramp to reach the top electrical connections.

Figure 5:
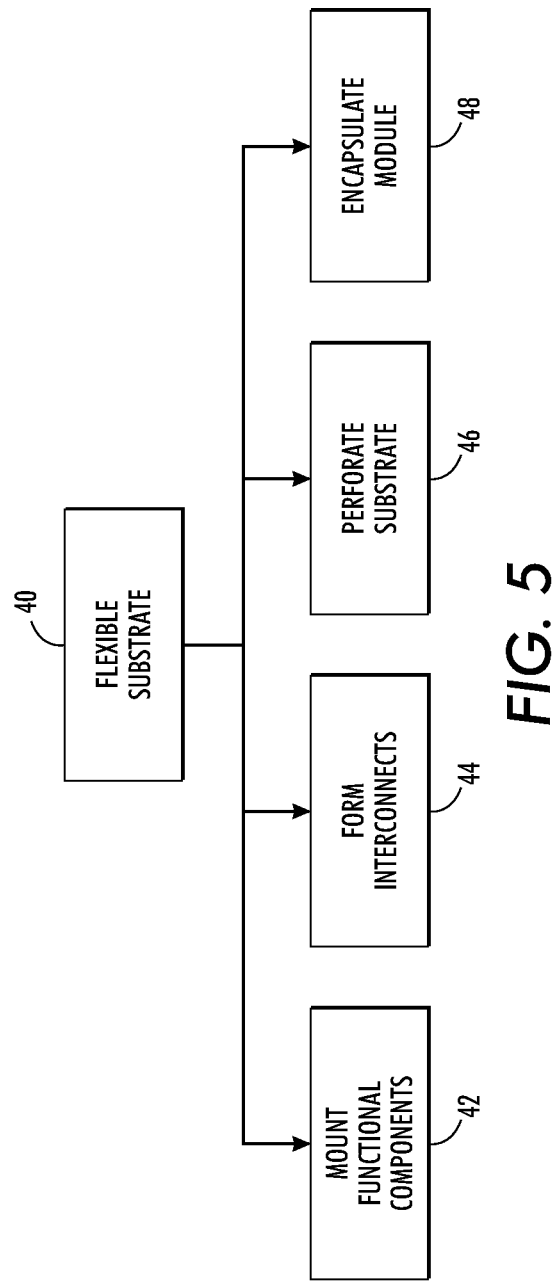
FIG. 5 shows a flow chart of a method of manufacturing an electronics module.

FIG. 5 shows an embodiment of the manufacturing process, which has high flexibility. The flexible substrate is provided at 40. In one embodiment, the functional components are mounted first at 42. The interconnects may then be formed as discussed above and then the perforations made last at 44. Alternatively, the perforations may be made next and then the interconnects printed to account for the perforations. In yet another embodiment, the perforations may occur last, with the perforations going through the encapsulant as well.

In another approach, the interconnects may be formed on the substrate first at 44. The perforation of the substrate may then occur at 46. Finally, with the interconnects and perforations completed, the components may be mounted at 42. Alternatively, the perforations may occur prior to the formation of the interconnects.

In yet another approach, the substrate may be perforated first at 46. The interconnects may then be formed at 44 and then the functional components mounted at 42. Alternatively, the functional components may be mounted at 42 and then the interconnects formed at 44.

As discussed previously, the mounting of the functional components may actually include the actual manufacture of the functional components. The functional components may be manufactured, on the substrate or in a separate process, to have shapes that conform to the perforations.

As discussed above, the perforations of the substrate are configured to allow the substrate to be stretchable. The specific design needs will dictate in which direction or directions the substrate needs to stretch. That in turn will dictate the shape and placement of the perforations. The actual perforations may result from laser cutting, stamping, cutting or other types of machining.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A method of manufacturing a flexible electronics module, comprising:

mounting at least two functional components onto a flexible substrate having conductors;

forming stretchable electrical interconnects from stretchable conductive materials to provide connection between the at least two functional components such that each functional component contacts at least one interconnect that connects to the other function components;

perforating the flexible substrate in a first direction to increase stretchability of the flexible substrate in a second direction after formation of the stretchable electrical interconnects to increase an ability to the flexible substrate to stretch and flex, wherein perforations are arranged in the first direction to avoid the stretchable electrical interconnects to the functional components, the functional components arranged to one of reside between the perforations or partially cover the perforations; and wherein the functional components have shapes that are at least partially conformal to shapes of the perforations in the substrate.

2. The method of manufacturing of claim 1, wherein perforating the flexible substrate occurs prior to the mounting of the functional components.

3. The method of manufacturing of claim 1, wherein mounting the functional components occurs prior to the perforating of the flexible substrate.

4. The method of manufacturing of claim 1, wherein forming the electrical interconnects between the functional components occurs prior to the mounting of the functional components.

5. The method of manufacturing of claim 1, further comprising encapsulating the electronics module with an elastomer after the mounting, forming and perforating.

6. The method of manufacture of claim 1, wherein perforating the flexible substrate comprises cutting the flexible substrate with one of angled cuts, curved cuts, or 'S' shaped cuts.

7. The method of manufacture of claim 1, wherein forming the electrical interconnects comprises printing a conductive material onto the flexible substrate.

* * * * *